(12) United States Patent
Wang et al.

(10) Patent No.: US 10,845,926 B2
(45) Date of Patent: Nov. 24, 2020

(54) CAPACITANCE DETECTING CIRCUIT, TOUCH DEVICE AND TERMINAL DEVICE

(71) Applicant: SHENZHEN GOODIX TECHNOLOGY CO., LTD., Shenzhen (CN)

(72) Inventors: Zhengfeng Wang, Shenzhen (CN); Shuo Fan, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/419,074

(22) Filed: May 22, 2019

(65) Prior Publication Data
US 2019/0272056 A1 Sep. 5, 2019

Related U.S. Application Data

(63) Continuation of application No. PCT/CN2018/073907, filed on Jan. 24, 2018.

(51) Int. Cl.
*G06F 3/044* (2006.01)
*H03K 17/96* (2006.01)
*G06F 3/041* (2006.01)

(52) U.S. Cl.
CPC ............ *G06F 3/044* (2013.01); *G06F 3/0416* (2013.01); *H03K 17/962* (2013.01)

(58) Field of Classification Search
None
See application file for complete search history.

(56) References Cited

U.S. PATENT DOCUMENTS

| | | | |
|---|---|---|---|
| 6,075,520 A | 6/2000 | Inoue et al. | |
| 6,353,337 B2 | 3/2002 | Nasu et al. | |
| 7,845,224 B2 | 12/2010 | Barlesi et al. | |
| 8,222,946 B2 | 7/2012 | Feng | |
| 2007/0143059 A1* | 6/2007 | Moser | G01L 9/12 |
| | | | 702/127 |
| 2009/0120159 A1* | 5/2009 | Barlesi | G01F 23/266 |
| | | | 73/1.73 |
| 2009/0273739 A1 | 11/2009 | Brown | |
| 2010/0073324 A1 | 3/2010 | Yang et al. | |

(Continued)

FOREIGN PATENT DOCUMENTS

CN 1189719 A 8/1998
CN 101076771 A 11/2007
(Continued)

*Primary Examiner* — Parul H Gupta

(57) ABSTRACT

The present application discloses a capacitance detecting circuit, a touch device and terminal device, which are beneficial for reducing an area of the capacitance detecting circuit, thereby reducing costs of a chip. The capacitance detecting circuit is connected to a measurement capacitor and where it includes a calibration capacitor; a charging and discharging module including a first current source configured to perform charging or discharging on the measurement capacitor, and a second current source configured to perform charging or discharging on the calibration capacitor; an integrator, configured to convert a capacitance signal of the measurement capacitor into a voltage signal; and a control module, configured to control working states of the charging and discharging module and the integrator.

20 Claims, 3 Drawing Sheets

(56) References Cited

U.S. PATENT DOCUMENTS

| | | |
|---|---|---|
| 2012/0001678 A1 | 1/2012 | Feng |
| 2014/0085252 A1 | 3/2014 | Hanssen et al. |
| 2015/0212650 A1* | 7/2015 | Noto .................. G06F 3/0418 345/174 |
| 2016/0224160 A1* | 8/2016 | Hanssen ............ H03K 17/9622 |
| 2017/0336893 A1 | 11/2017 | Hanssen et al. |

FOREIGN PATENT DOCUMENTS

| | | |
|---|---|---|
| CN | 101477152 A | 7/2009 |
| CN | 101943716 A | 1/2011 |
| CN | 102253289 A | 11/2011 |
| CN | 102314268 A | 1/2012 |
| CN | 103324366 A | 9/2013 |
| CN | 103376965 A | 10/2013 |
| CN | 103376967 A | 10/2013 |
| CN | 104808880 A | 7/2015 |
| CN | 206440771 U | 8/2017 |
| TW | I574193 B | 3/2017 |

\* cited by examiner

CAPACITANCE DETECTING CIRCUIT, TOUCH DEVICE AND TERMINAL DEVICE

CROSS REFERENCE TO RELATED APPLICATIONS

The present application is a continuation of international application No. PCT/CN2018/073907, filed on Jan. 24, 2018, which is hereby incorporated by reference in its entirety.

TECHNICAL FIELD

Embodiments of the present application relate to the field of capacitance detection, and in particular, to a capacitance detecting circuit, a touch device, and a terminal device.

BACKGROUND

A capacitive sensor (or a capacitance sensor) is widely used in an electronic device, for example, the capacitance sensor may be used as an input device to provide input information such as a position, motion, a force, a duration, or the like. A core part of the capacitance sensor is a capacitance detecting circuit including a sensing capacitor, an integrator and an analog to digital converter (Analog to Digital Converter, ADC). When a user operates the capacitance sensor, a capacitance value of the sensing capacitor changes, the integrator is configured to convert a capacitance effect generated when the user operates the capacitance sensor into a voltage signal. The voltage signal is converted into a digital signal after being sampled by the ADC, and then capacitance detection can be performed according to the digital signal.

In order to more effectively detect a variation of a capacitance value of the sensing-capacitor caused by a user operation, a calibration capacitor may be added to the capacitance detecting circuit, and a capacitance value of the calibration capacitor is generally set to be approximately equal to a capacitance value of the sensing-capacitor when the capacitance sensor is not operated. Therefore, if the capacitance value of the sensing-capacitor is large when the capacitance sensor is not operated, it is required that the capacitance value of the calibration capacitor is large as well, and thus an area of the capacitance detecting circuit and costs of a chip are increased.

SUMMARY

Embodiments of the present application provide a capacitance detecting circuit, a touch device and a terminal equipment, which are beneficial for reducing an area of the capacitance detecting circuit, thereby reducing costs of a chip.

In a first aspect, provided is a capacitance detecting circuit connected to a measurement capacitor, and including:

a calibration capacitor;

a charging and discharging module including a first current source configured to perform charging or discharging on the measurement capacitor, and a second current source configured to perform charging or discharging on the calibration capacitor;

an integrator, configured to convert a capacitance signal of the measurement capacitor into a voltage signal; and a control module, configured to control working states of the charging and discharging module and the integrator.

Therefore, according to the capacitance detecting circuit of an embodiment of the present application, the first current source may perform charging or discharging on the measurement capacitor and the second current source may perform charging or discharging on the calibration capacitor, so that a purpose of adjusting a capacitance value of the calibration capacitor can be achieved by adjusting a proportional relationship between a current value of a first current source and a current value of a second current source. For example, by setting the current value of the first current source to be greater than the current value of the second current source, the capacitance value of the calibration capacitor can be less than a reference capacitance value, and thus an area of the capacitance detecting circuit and costs of a chip can be reduced.

Optionally, the calibration capacitor is configured to cause an output voltage of the integrator to be equal to a reference voltage when a capacitance value of the measurement capacitor is equal to a reference capacitance value, where a ratio of the reference capacitance value to a capacitance value of the calibration capacitor is equal to a ratio of a current value of the first current source to a current value of the second current source.

In some possible implementations, the capacitance detecting circuit further includes a set of charging and discharging switches, a set of clearing switches and a set of integrating switches, and the integrator includes an integrating capacitor and an amplifier;

the control module is configured to:

in a charge clearing phase, clear charges stored on the integrating capacitor through the set of clearing switches;

in a charging and discharging phase, control the first current source to perform charging or discharging on the measurement capacitor through the set of charging and discharging switches and control the second current source to perform charging or discharging on the calibration capacitor through the set of charging and discharging switches, where in the charging and discharging phase, the measurement capacitor is charged or discharged until a voltage is equal to a reference voltage, a charging duration of the calibration capacitor is equal to a charging duration of the measurement capacitor, or a discharging duration of the calibration capacitor is equal to a discharging duration of the measurement capacitor; and in a charge transferring phase, control a part of charges stored on the calibration capacitor to be transferred to the integrating capacitor through the set of integrating switches.

In some possible implementations, the set of charging and discharging switches includes a first switch, a second switch, a third switch and a fourth switch, the set of integrating switches includes a fifth switch, and the set of clearing switches includes a sixth switch;

one end of the first switch is connected to one end of the first current source, the other end of the first current source is connected to a power supply voltage, the other end of the first switch is connected to one end of the measurement capacitor and one end of the third switch, and the other end of the measurement capacitor and the other end of the third switch are grounded;

one end of the second switch is connected to one end of the second current source, the other end of the second current source is connected to a power supply voltage, the other end of the second switch is connected to one end of the calibration capacitor and one end of the fourth switch, and the other end of the calibration capacitor and the other end of the fourth switch are grounded;

one end of the fifth switch is connected to one end of the calibration capacitor, the other end of the fifth switch is connected to a first input end of the amplifier, and a second input end of the amplifier is configured to input the reference voltage; and the sixth switch is connected in parallel with the integrating capacitor, and the integrating capacitor is connected in parallel with the amplifier.

In some possible implementations, in the charge clearing phase, the sixth switch is turned on, the first switch, the second switch, the third switch, the fourth switch, and the fifth switch are all turned off, and charges stored on the integrating capacitor are cleared; and the charging and discharging phase includes a discharging phase and a charging phase, and the discharging phase is prior to the charging phase, where in the discharging phase, the third switch and the fourth switch are turned on, the first switch, the second switch, the fifth switch and the sixth switch are all turned off, charges stored on the measurement capacitor and the calibration capacitor are cleared;

in the charging phase, the first switch and the second switch are turned on, the third switch, the fourth switch, the fifth switch and the sixth switch are all turned off, the measurement capacitor is charged until the voltage is equal to the reference voltage, and after the measurement capacitor is charged until the voltage is equal to the reference voltage, the first switch and the second switch are turned off; and in the charge transferring phase, the first switch, the second switch, the third switch, the fourth switch and the sixth switch are all turned off, the fifth switch is turned on, and a part of charges on the calibration capacitor are transferred to the integrating capacitor.

In some possible implementations, a first buffering phase is included between the charging and discharging phase and the charge transferring phase, and a second buffering phase is included after the charge transferring phase, where the first buffering phase and the second buffering phase are used to maintain charges on the measurement capacitor, the calibration capacitor and the integrating capacitor unchanged;

where in the first buffering phase and the second buffering phase, the first switch, the second switch, the third switch, the fourth switch, the fifth switch and the sixth switch are all turned off.

Therefore, according to the capacitance detecting circuit of an embodiment of the present application, the measurement capacitor and the calibration capacitor are first discharged, and the first current source and the second current source charge the measurement capacitor and the calibration capacitor respectively, and thus a purpose of controlling a proportional relationship between the reference capacitance value and the capacitance value of the calibration capacitor through the proportional relationship between the current value of the first current source and the current value of the second current source can be achieved. Therefore, as long as the current value of the first current source is set to be greater than the current value of the second current source, a purpose of reducing the capacitance value of the calibration capacitor can be achieved, and thus the area of the capacitance detecting circuit and the costs of the chip can be reduced.

In some possible implementations, the control module is further configured to:

control the set of charging and discharging switches, the set of integrating switches, and the set of clearing switches to repeatedly execute operations from the charging and discharging phase to the second buffering phase for multiple times.

In some possible implementations, an output voltage $V_{out}$ of the integrator is:

$$V_{out} = V_R - \frac{\Delta C_x I_2 / I_1}{C_S} V_R N$$

where the $V_R$ is the reference voltage, the $\Delta C_x$ is a variation of a capacitance value of the measurement capacitor with respect to the reference capacitance value, the $C_S$ is a capacitance value of the integrating capacitor, the $I_1$ is a current value of the first current source, the $I_2$ is a current value of the second current source, and the N is the number of execution times from the charging and discharging phase to the second buffering phase.

Therefore, according to the capacitance detecting circuit of the embodiment of the present application, it is beneficial to improve sensitivity of capacitance detection by executing operations from the charging and discharging phase to the second buffering phase for multiple times.

In some possible implementations, the set of charging and discharging switches includes a first switch, a second switch, a third switch and a fourth switch, the set of integrating switches includes a fifth switch, and the set of clearing switches includes a sixth switch;

one end of the first switch is connected to one end of the first current source, the other end of the first current source is grounded, the other end of the first switch is connected to one end of the measurement capacitor and one end of the third switch, the other end of the measurement capacitor is grounded, and the other end of the third switch is connected to a power supply voltage;

one end of the second switch is connected to one end of the second current source, the other end of the second current source is grounded, the other end of the second switch is connected to one end of the calibration capacitor and one end of the fourth switch, the other end of the calibration capacitor is grounded, and the other end of the fourth switch is connected to a power supply voltage;

one end of the fifth switch is connected to one end of the calibration capacitor, the other end of the fifth switch is connected to a first input end of the amplifier, and a second input end of the amplifier is configured to input the reference voltage; and the sixth switch is connected in parallel with the integrating capacitor, and the integrating capacitor is connected in parallel with the amplifier.

In some possible implementations, in the charge clearing phase, the sixth switch is turned on, the first switch, the second switch, the third switch, the fourth switch, and the fifth switch are all turned off, and charges stored on the integrating capacitor are cleared; and the charging and discharging phase includes a charging phase and a discharging phase, and the charging phase is prior to the discharging phase, where in the charging phase, the third switch and the fourth switch are turned on, the first switch, the second switch, the fifth switch and the sixth switch are all turned off, the measurement capacitor and the calibration capacitor are both charged until a voltage is equal to the power supply voltage;

in the discharging phase, the first switch and the second switch are turned on, the third switch, the fourth switch, the fifth switch and the sixth switch are all turned off, the measurement capacitor is discharged from the power supply voltage to a voltage equal to the reference voltage, and after the measurement capacitor is discharged until the voltage is equal to the reference voltage, the first switch and the second switch are turned off; and in the charge transferring phase, the first switch, the second switch, the third switch, the fourth switch and the sixth switch are all turned off, the fifth switch is turned on, and a part of charges on the calibration capacitor are transferred to the integrating capacitor.

In some possible implementations, a first buffering phase is included between the charging and discharging phase and the charge transferring phase, and a second buffering phase is included after the charge transferring phase, where the first buffering phase and the second buffering phase are used to maintain charges on the measurement capacitor, the calibration capacitor and the integrating capacitor unchanged;

where in the first buffering phase and the second buffering phase, the first switch, the second switch, the third switch, the fourth switch, the fifth switch and the sixth switch are all turned off.

Therefore, according to the capacitance detecting circuit of an embodiment of the present application, the measurement capacitor and the calibration capacitor are first charged, and the first current source performs discharging on the measurement capacitor and the second current source performs discharging on the calibration capacitor, and thus a purpose of controlling a proportional relationship between the reference capacitance value and the capacitance value of the calibration capacitor through the proportional relationship between the current value of the first current source and the current value of the second current source can be achieved. Therefore, as long as the current value of the first current source is set to be greater than the current value of the second current source, a purpose of reducing the capacitance value of the calibration capacitor can be achieved, and thus the area of the capacitance detecting circuit and the costs of the chip can be reduced.

In some possible implementations, the control module is further configured to:

control the set of charging and discharging switches, the set of integrating switches, and the set of clearing switches to repeatedly execute operations from the charging and discharging phase to the second buffering phase for multiple times.

In some possible implementations, an output voltage $V_{out}$ of the integrator is:

$$V_{out} = V_R - \frac{\Delta C_x I_2 / I_1}{C_S}(V_{DD} - V_R) \cdot N$$

where the $V_R$ is the reference voltage, the $\Delta C_x$ is a variation of a capacitance value of the measurement capacitor with respect to the reference capacitance value, the $C_S$ is a capacitance value of the integrating capacitor, the $I_1$ is a current value of the first current source, the $I_2$ is a current value of the second current source, the $V_{DD}$ is the power supply voltage, and the N is the number of execution times from the charging and discharging phase to the second buffering phase.

Therefore, according to the capacitance detecting circuit of the embodiment of the present application, it is beneficial to improve sensitivity of capacitance detection by executing operations from the charging and discharging phase to the second buffering phase for multiple times.

In some possible implementations, the capacitance detecting circuit further includes a comparator, a first input end of the comparator is connected to the measurement capacitor, a second input end of the comparator is configured to input the reference voltage, and an output end of the comparator is connected to the control module;

when a voltage of the measurement capacitor reaches the reference voltage, an output signal of the comparator is reversed, and the control module controls the charging and discharging module to stop performing charging or discharging on the measurement capacitor and the calibration capacitor.

In some possible implementations, the capacitance detecting circuit further includes a processing module configured to determine a variation of a capacitance value of the measurement capacitor with respect to the reference capacitance value according to an output voltage of the integrator.

In some possible implementations, a current value of the first current source is greater than a current value of the second current source.

In some possible implementations, the capacitance detecting circuit is applied to a capacitance sensor, the measurement capacitor is a sensing-capacitor of the capacitance sensor, and the reference value is a capacitance value of the sensing-capacitor when the capacitance sensor is not operated.

In a second aspect, provided is a touch device including the capacitance detecting circuit in the first aspect and any one of the possible implementations of the first aspect.

In a third aspect, provided is a terminal device including the capacitance detecting circuit in the first aspect and any one of the possible implementations of the first aspect.

DESCRIPTION OF EMBODIMENTS

Embodiments of the present application will be described hereinafter in conjunction with drawings in the embodiments of the present application.

Figure 1:
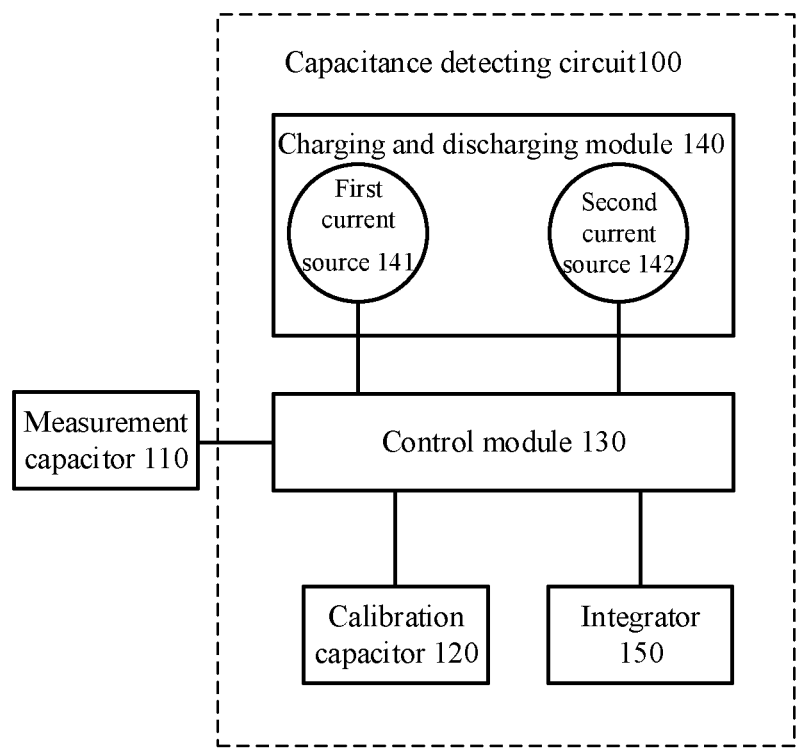
FIG. 1 is a schematic structural diagram of a capacitance detecting circuit according to an embodiment of the present application.

FIG. 1 is a schematic structural diagram of a capacitance detecting circuit 100 according to an embodiment of the present application. As shown in FIG. 1, the capacitance detecting circuit 100 is connected to a measurement capacitor 110, and the capacitance detecting circuit 100 includes:

a calibration capacitor 120;

a charging and discharging module 140, including a first current source 141 configured to perform charging or discharging on the measurement capacitor 110, and a second current source 142 configured to perform charging or discharging on the calibration capacitor 120;

an integrator 150, configured to convert a capacitance signal of the measurement capacitor 110 into a voltage signal; and a control module 130, configured to control working states of the charging and discharging module 140 and the integrator 150.

Optionally, in an embodiment of the present application, the calibration capacitor 120 is configured to cause an output voltage of the integrator 150 to be equal to a reference voltage when a capacitance value of the measurement capacitor 110 is equal to a reference capacitance value, where a ratio of the reference capacitance value to a capacitance value of the calibration capacitor is equal to a ratio of a current value of the first current source 141 to a current value of the second current source 142.

It should be understood that the capacitance detecting circuit of the embodiment of the present application can be applied to various circuits or systems that require capacitance detection, in particular, the capacitance detecting circuit can be applied to a capacitance sensor; in this case, the measurement capacitor may be a sensing-capacitor of the capacitance sensor, a reference capacitance value of the measurement capacitor may be a capacitance value of the sensing-capacitor when a user does not operate the capacitance sensor, and the reference capacitance value may also be referred to as a base capacitance, or a self-capacitance, or the like. When the user operates the capacitance sensor, the capacitance value of the measurement capacitor changes, an integrator may convert a capacitance signal (or referred to as a capacitance effect) of the measurement capacitor into a voltage signal, and further, the capacitance value of the measurement capacitor may be determined according to the voltage signal.

The capacitance detecting circuit of the embodiment of the application may include a first current source configured to perform charging or discharging on the measurement capacitor and a second current source configured to perform charging or discharging on the calibration capacitor. The calibration capacitor is configured to cause an output voltage of the integrator to be equal to the reference voltage when the capacitance value of the measurement capacitor is equal to a reference capacitance value, or the calibration capacitor is configured to cancel a contribution of the output voltage of the integrator when the capacitance value of the measurement capacitor is equal to the reference capacitance value. Therefore, in the embodiment of the present application, a purpose of adjusting the capacitance value of the calibration capacitor can be achieved by adjusting a proportional relationship between the current value of the first current source and the current value of the second current source. For example, by setting the current value of the first current source to be greater than the current value of the second current source, the capacitance value of the calibration capacitor may be less than the reference capacitance value of the measurement capacitor, and with respect to the calibration capacitor in the prior art whose capacitance value is equal to or approximately equal to the reference capacitance value of the measurement capacitor, the present application is beneficial for reducing an area of the capacitance detecting circuit and costs of a chip.

Optionally, in the embodiment of the present application, the calibration capacitor may be a capacitor or a capacitor array with variable capacitance values, or may also be a capacitor or a capacitor array with a fixed capacitance value, which is not limited in the embodiment of the present application. The first current source and the second current source may be current sources having a proportional relationship, for example, the first current source and the second current source may be obtained by mirroring a current source, and the proportional relationship between the current value of the first current source and the current value of the second current source may be fixed or adjustable, which is not limited in the embodiment of the present application.

Optionally, in the embodiment of the present application, the capacitance detecting circuit 100 may further include a set of charging and discharging switches, a set of clearing switches and a set of integrating switches, and the integrator may include an integrating capacitor and an amplifier;

a control module 130 may control working states of the charging and discharging module and integrator through the set of charging and discharging switches, the set of clearing switches and the set of integrating switches, for example, controlling when the charging and discharging module charges the measurement capacitor and the calibration capacitor and when the charging and discharging module performs discharging on the measurement capacitor and the calibration capacitor, and controlling when the integrator performs integration.

Specifically, in a charge clearing phase, charges stored on the integrating capacitor through the set of clearing switches are cleared;

in a charging and discharging phase, the first current source is controlled to perform charging or discharging on the measurement capacitor through the set of charging and discharging switches and the second current source is controlled to perform charging or discharging on the calibration capacitor through the set of charging and discharging switches, where in the charging and discharging phase, the measurement capacitor is charged or discharged until a voltage is equal to a reference voltage, a charging duration of the calibration capacitor is equal to a charging duration of the measurement capacitor, or a discharging duration of the calibration capacitor is equal to a discharging duration of the measurement capacitor; and in a charge transferring phase, a part of charges stored on the calibration capacitor is controlled to be transferred to the integrating capacitor through the set of integrating switches.

Optionally, in the embodiment of the present application, a first buffering phase may be further included between the charging and discharging phase and the charge transferring phase, and a second buffering phase may be further included after the charge transferring phase, where the first buffering phase and the second buffering phase are used to avoid a charge leakage problem caused by frequent switching of switches, where charges on the measurement capacitor, the calibration capacitor and the integrating capacitor are unchanged in the first buffering phase and the second buffering phase.

Optionally, in some embodiments, the capacitance detecting circuit 100 may further include a comparator, a first input end of the comparator is connected to the measurement capacitor, a second input end of the comparator is configured to input the reference voltage, and an output end of the comparator is connected to the control module;

specifically, when a voltage of the measurement capacitor reaches the reference voltage, an output signal of the comparator is reversed (for example, reversed from a low level to a high level, or reversed from a high level to a low level), and the control module controls the charging and discharging module to stop performing charging or discharging on the measurement capacitor and the calibration capacitor when the output signal of the comparator is reversed.

In other words, when the voltage on the measurement capacitor reaches the reference voltage (for example, the measurement capacitor is charged until a voltage is equal to the reference voltage or the measurement capacitor is discharged until a voltage is equal to the reference voltage), the output signal of the comparator is reversed, the output signal may be used as an input signal of the control module. The control module may control the charging and discharging module to stop performing charging or discharging on the measurement capacitor and the calibration capacitor when the output signal of the comparator is reversed, that is, controlling the first current source to stop performing charging or discharging on the measurement capacitor, and controlling the second current source to stop performing charging or discharging on the calibration capacitor. Specifically, the control module may control the charging and discharging module to stop performing charging or discharging on the measurement capacitor and the calibration capacitor through the set of charging and discharging switches.

It should be understood that in the embodiment of the present application, an equivalent circuit of the comparator may also be used to implement the foregoing function, as long as the charging and discharging module is controlled to stop performing charging or discharging on the measurement capacitor and the calibration capacitor when the voltage of the measurement capacitor reaches the reference voltage, which is not specifically limited in the embodiment of the present application.

Optionally, in some embodiments, the capacitance detecting circuit 100 may further include a processing module configured to determine a variation of a capacitance value of the measurement capacitor with respect to the reference capacitance value according to an output voltage of the integrator.

For example, the processing module may be an ADC, or may be other circuits or modules with a processing function, which is not limited in the embodiment of the present application. The processing module may determine the capacitance value of the measurement capacitor according to the output voltage of the integrator. Specifically, the processing module may convert a voltage signal output by the integrator into a digital signal, and a capacitance value of the measurement capacitor may be determined according to the digital signal. For example, if the capacitance detecting circuit is applied to a capacitance sensor, the processing module may determine a digital signal when the user does not operate the capacitance sensor, and determine another digital signal when the user operates the capacitance sensor, and a variation of a capacitance value of a sensing-capacitor may be determined according to a difference value between the two digital signals.

Hereinafter, implementations of a capacitance detecting circuit according to an embodiment of the present application will be described in detail with reference to specific examples in FIGS. 2 to 5.

It should be understood that the examples shown in FIGS. 2 to 5 are intended to help persons skilled in the art to better understand embodiments of the present application, rather than limiting the scope of the embodiments of the present application. It will be obvious to persons skilled in the art that various equivalent modifications or variations can be made according to the provided FIGS. 2 to 5, and such modifications or variations also fall within the scope of the embodiments of the present application.

Figure 2:
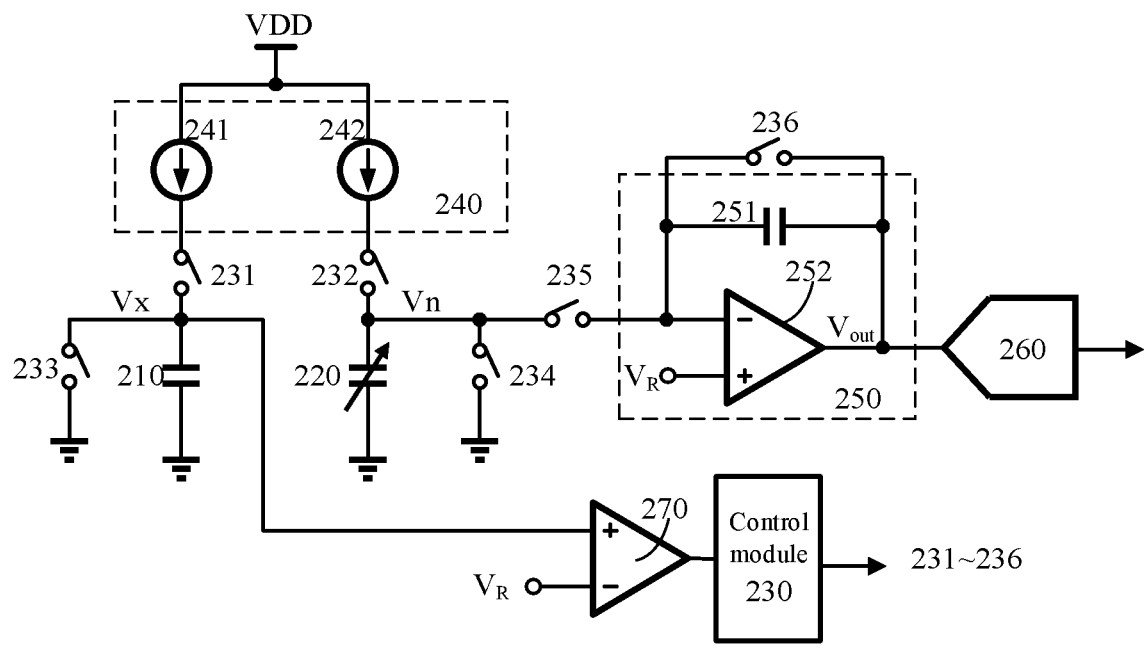
FIG. 2 is a schematic diagram of a capacitance detecting circuit according to an embodiment of the present application.

FIG. 2 is a circuit structure diagram of a capacitance detecting circuit 200 according to an embodiment of the present application. As shown in FIG. 2, the capacitance detecting circuit 200 includes a measurement capacitor 210, a calibration capacitor 220, a control module 230, a charging and discharging module 240, an integrator 250, a processing module 260, and a comparator 270.

The charging and discharging module 240 includes a first current source 241 and a second current source 242, and the integrator 250 includes an integrating capacitor 251 and an amplifier 252.

The capacitance detecting circuit further includes a set of charging and discharging switches, a set of clearing switches and a set of integrating switches, where the set of charging and discharging switches includes a first switch 231, a second switch 232, a third switch 233 and a fourth switch 234, the set of integrating switches includes a fifth switch 235, and the set of clearing switches includes a sixth switch 236.

Specifically, one end of the first switch 231 is connected to one end of the first current source 241, the other end of the first current source 241 is connected to a power supply voltage ($V_{DD}$), the other end of the first switch 231 is connected to one end of the measurement capacitor 210 and one end of the third switch 233, and the other end of the measurement capacitor 210 and the other end of the third switch 233 are grounded, where the measurement capacitor 210 is a measurement capacitor formed by a driving electrode and a sensing electrode on a touch panel.

one end of the second switch 232 is connected to one end of the second current source 242, the other end of the second current source is connected to a power supply voltage (that is, $V_{DD}$), the other end of the second switch 232 is connected to one end of the calibration capacitor 220 and one end of the fourth switch 234, and the other end of the calibration capacitor 220 and the other end of the fourth switch 234 are grounded; that is, one end (for example, an upper plate) of the calibration capacitor 220 is connected to the power supply voltage $V_{DD}$ through the second switch 232 and the second current source 242, and the same end (for example, the upper plate) of the calibration capacitor 220 is grounded through the fourth switch 234, and the other end (for example, a lower plate) of the calibration capacitor 220 is grounded. From this, it can be clearly seen that the calibration capacitor 220 and the measurement capacitor 210 are independent capacitors, and there is no common electrode plate between them;

one end of the fifth switch 235 is connected to one end of the calibration capacitor 220, the other end of the fifth switch 235 is connected to a first input end (that is, a negative input end) of the amplifier 252, and a second input end (that is, a positive input end) of the amplifier 252 is configured to input the reference voltage (denoted as $V_R$);

the sixth switch 236 is connected in parallel with the integrating capacitor 251, and the integrating capacitor 251 is connected in parallel with the amplifier 252, that is, the integrating capacitor 251 is connected across the negative input end and the output end of the amplifier 252; and a first input end (such as a positive input end) of the comparator 270 is connected to one end of the measurement capacitor 210, and a second input end (such as a negative input end) of the comparator 270 is configured to input the reference voltage $V_R$. Certainly, a connection manner of the positive and negative input ends of the comparator 270 may also be reversed, which is not limited herein.

Further, the output end of the integrator 250 may be connected to a processing module 260, which may be configured to process an output signal $V_{out}$ of the integrator 250 to determine the capacitance value of the measurement capacitor 210.

Hereinafter, a working process of the capacitance detecting circuit shown in FIG. 2 will be described in detail with reference to a logic timing diagram shown in FIG. 3.

Figure 3:
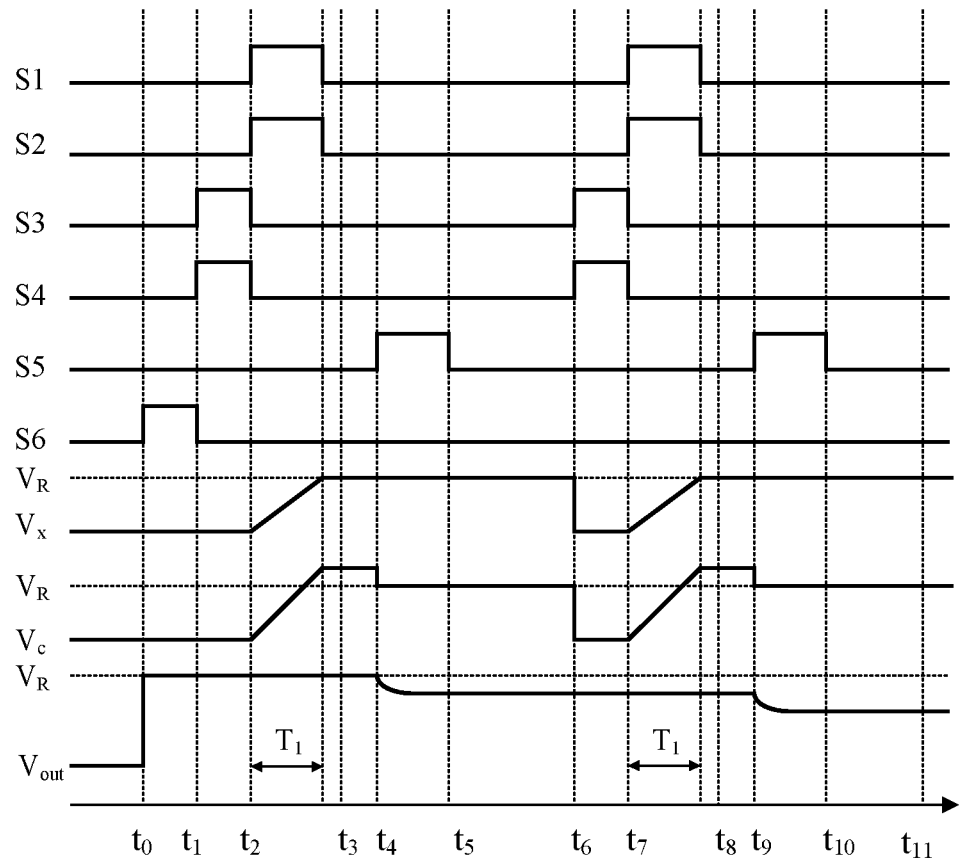
FIG. 3 is a logic timing diagram of a capacitance detecting circuit according to an embodiment of the present application.

It should be noted that in FIG. 3, S1 to S6 are control signals of the first switch 231 to the sixth switch 236, respectively. When a control signal is at a high level, the corresponding switch is turned on, and when a control signal is at a low level, the corresponding switch is turned off. $V_x$ and $V_c$ are voltage curves of the measurement capacitor 210 and the calibration capacitor 220, respectively, and $V_{out}$ is the output voltage of the integrator 250.

In a charge clearing phase (corresponding to a time period $t_0$–$t_1$ in FIG. 3), the sixth switch 236 is turned on, and the first switch 231, the second switch 232, the third switch 233, the fourth switch 234 and the fifth switch 235 are all turned off, charges stored on the integrating capacitor 251 are cleared; that is, the quantity of charges on the integrating capacitor 251 is zero at time $t_1$, and the output voltage $V_{out}$ of the integrator 250 is equal to $V_R$ according to a virtual short characteristic of an amplifier.

A charging and discharging phase includes a discharging phase (corresponding to a time period $t_1$–$t_2$ in FIG. 3) and a charging phase (corresponding to a time period $t_2$–$t_3$ in FIG. 3). In this embodiment, the discharging phase is prior to the charging phase, that is, the measurement capacitor 210 and the calibration capacitor 220 are discharged, and then the measurement capacitor 210 and the calibration capacitor 220 are charged.

Specifically, in the time period $t_1$–$t_2$, the third switch 233 and the fourth switch 234 are turned on, the first switch 231, the second switch 232, the fifth switch 235 and the sixth switch 236 are all turned off, and charges stored on the measurement capacitor 210 and the calibration capacitor 220 are cleared; that is, in the time period $t_1$–$t_2$, the measurement capacitor 210 and the calibration capacitor 220 are completely discharged, and at time $t_2$, the quantities of charges on the measurement capacitor 210 and the calibration capacitor 220 are zero and the output voltage $V_{out}$ of the integrator 250 is equal to $V_R$.

In the time period $t_2$–$t_3$, the first switch 231 and the second switch 232 are turned on, the third switch 233, the fourth switch 234, the fifth switch 235 and the sixth switch 236 are all turned off, and the first current source 241 charges the measurement capacitor 210 and the second current source 242 charges the calibration capacitor 220. When a voltage $V_x$ on the measurement capacitor 210 reaches the reference voltage $V_R$, an output state of the comparator 270 is reversed. At this time, the control module controls the first switch 231 and the second switch 232 to be turned off, that is, controlling the first current source 241 and the second current source 242 to stop charging the measurement capacitor 210 and the calibration capacitor 220.

A duration $T_1$ required for charging the measurement capacitor 210 to the voltage equal to the reference voltage $V_R$ is as follows:

$$T_1 = \frac{V_R C_x}{I_1}, \qquad \text{Equation (1)}$$

where the $C_x$ is the reference capacitance value of the measurement capacitor 210 and $I_1$ is the current value of the first current source.

Since a charging duration of the calibration capacitor 220 is equal to that of the measurement capacitor 210, when charging is completed, the quantity of charges $Q_{Cc}$ stored on the calibration capacitor 220 is as follows:

$$Q_{Cc} = I_2 T_1 = \frac{I_2 V_R C_x}{I_1}, \qquad \text{Equation (2)}$$

where $I_2$ is the current value of the second current source.

Since the measurement capacitor 220 needs a duration $T_1$ to charge to the reference voltage $V_R$, a duration of the time period $t_2$–$t_3$ needs to be greater than or equal to the duration $T_1$, that is, $t_3 - t_2 \geq T_1$.

Optionally, in order to avoid charge leakage caused by frequent switching of switches, a first buffering phase (corresponding to a time period $t_3$–$t_4$ in FIG. 3) may be further included after the charging and discharging phase. In the first buffering phase, charges on the measurement capacitor 210, the calibration capacitor 220 and the integrating capacitor 251 remain unchanged, and specifically, in the first buffering phase, the first switch 231 to the sixth switch 236 are all turned off.

Thereafter, in the charge transferring phase (corresponding to a time period $t_4$–$t_5$ in FIG. 3), the fifth switch 235 is turned on, and the first switch 231, the second switch 232, the third switch 233, the fourth switch 234 and the sixth switch 236 are all turned off. Due to a virtual short characteristic of an amplifier, a voltage at a negative input end of the amplifier 252 is equal to that of a positive input end of the amplifier 252, that is, both are equal to the reference voltages $V_R$. Therefore, a voltage of an upper plate of the calibration capacitor 220 and a voltage of a left plate of the integrating capacitor 251 are clamped to the reference voltage $V_R$; and due to a virtual open characteristic of an amplifier, in the time period $t_4$–$t_5$, charges stored on the calibration capacitor 220 are redistributed on the calibration capacitor 220 and the integrating capacitor 251, and a charge balance equation is as shown in Equation (3):

$$\frac{I_2 V_R C_x}{I_1} = V_R C_c + (V_R - V_{out}) \cdot C_S, \qquad \text{Equation (3)}$$

where the $C_c$ is the capacitance value of the calibration capacitor 220, the $C_S$ is the capacitance value of the integrating capacitor 251, the $V_R C_c$ is the quantity of charges stored on the calibration capacitor 220 after charge transfer, and the $(V_R - V_{OUT}) \cdot C_S$ is the quantity of charges stored on the integrating capacitor 251 after charge transfer.

According to Equation (3), it can be seen that the output voltage $V_{out}$ of the integrator 250 is shown as follows:

$$V_{out} = V_R + \frac{(C_C - C_x I_2 / I_1)}{C_S} \cdot V_R. \qquad \text{Equation (4)}$$

It can be seen from Equation (4) that, by controlling the capacitance value $C_c$ of the calibration capacitor 220 and the current value $I_1$ of the first current source, the current value $I_2$ of the second current source satisfies $C_C - C_X I_2 / I_1 = 0$, that is, $C_C = C_X I_2 / I_1$, and thus, when the capacitance value of the measurement capacitor 210 is equal to the reference capacitance value, the output voltage $V_{out}$ of the integrator 250 is equal to the reference voltage $V_R$; that is, when the user does not operate the capacitance sensor, the output voltage of the integrator is equal to the reference voltage.

From the equation $C_C=C_XI_2/I_1$, it can be seen that $C_C<C_X$ can be achieved as long as $I_2/I_1<1$ is set, and thus a purpose of reducing the capacitance value of the calibration capacitor can be achieved.

Optionally, in order to avoid charge leakage caused by frequent switching of switches, a second buffering phase (corresponding to a time period $t_5$–$t_6$ in FIG. 3) may be further included after the charge transferring phase. In the second buffering phase, charges on the measurement capacitor 210, the calibration capacitor 220 and the integrating capacitor 251 remain unchanged, and specifically, in the second buffering phase, the first switch 231 to the sixth switch 236 are all turned off.

Optionally, in an embodiment of the present application, operations from the charging and discharging phase to the second buffering phase may be repeatedly executed for multiple times, for example, in a time period $t_6$–$t_7$ after time $t_6$, related operations in the time period $t_1$–$t_2$ may be executed, in a time period $t_7$–$t_8$, related operations in the time period $t_2$–$t_3$ may be executed, in a time period $t_8$–$t_9$, related operations in the time period $t_3$–$t_4$ may be executed, in a time period $t_9$–$t_{10}$, related operations in the time period $t_4$–$t_5$ may be executed, and in a time period $t_{10}$–$t_{11}$, related operations in the time period $t_5$–$t_6$ may be executed. A next repeated execution process is similar and will not be repeatedly descried herein.

Then, when the foregoing $t_1$–$t_6$ processes are repeatedly executed for N times, the output voltage $V_{out}$ of the integrator is as follows:

$$V_{out} = V_R + \frac{(C_C - C_xI_2/I_1)}{C_S} \cdot V_R \cdot N. \quad \text{Equation (5)}$$

In a case that $C_C=C_XI_2/I_1$ is satisfied, when the capacitance value of the measurement capacitor changes (for example, when the measurement capacitor is touched by a finger), for example, when the capacitance value of the measurement capacitor changes from the reference capacitance value $C_x$ to $C_x+\Delta C_x$, the output voltage $V_{out}$ of the integrator is as follows:

$$V_{out} = V_R - \frac{\Delta C_xI_2/I_1}{C_S} \cdot V_R \cdot N. \quad \text{Equation (6)}$$

In one embodiment, the variation of the capacitance value of the measurement capacitor can be calculated according to $V_{out}$ and N, so as to determine whether it is touched. It can be seen from Equation (6) that the foregoing processes are repeatedly executed for multiple times, which is beneficial for improving sensitivity of capacitance detection.

Therefore, according to the capacitance detecting circuit of an embodiment of the present application, the measurement capacitor and the calibration capacitor are first discharged, and the first current source and the second current source charge the measurement capacitor and the calibration capacitor respectively, and thus a purpose of controlling a proportional relationship between the reference capacitance value and the capacitance value of the calibration capacitor through the proportional relationship between the current value of the first current source and the current value of the second current source can be achieved. Therefore, as long as the current value of the first current source is set to be greater than the current value of the second current source, a purpose of reducing the capacitance value of the calibration capacitor can be achieved, and thus the area of the capacitance detecting circuit and the costs of the chip can be reduced.

Figure 4:
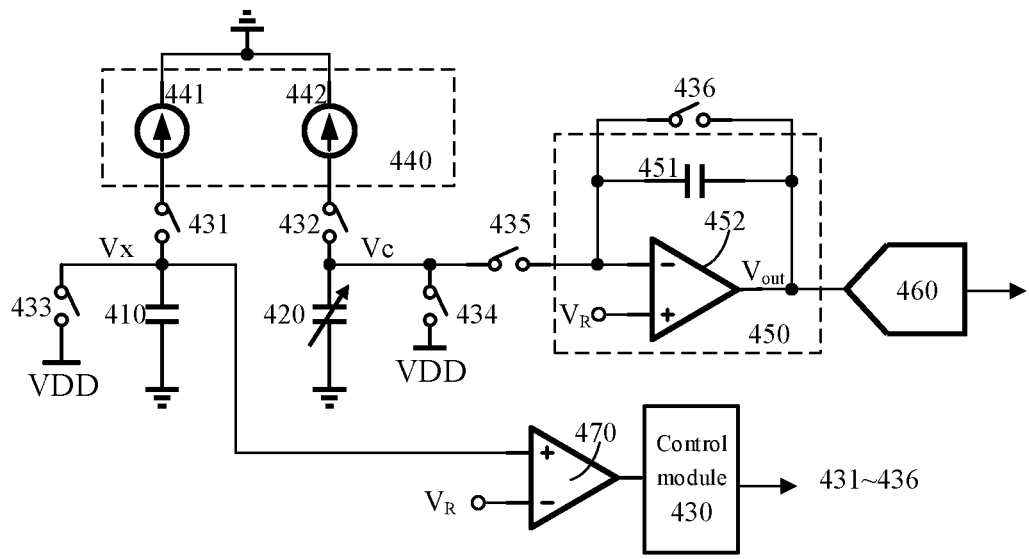
FIG. 4 is a schematic diagram of a capacitance detecting circuit according to another embodiment of the present application.

FIG. 4 is a schematic structural diagram of a capacitance detecting circuit 400 according to another embodiment of the present application. As shown in FIG. 4, the capacitance detecting circuit 400 includes a measurement capacitor 410, a calibration capacitor 420, a control module 430, a charging and discharging module 440, an integrator 450, a processing module 460, and a comparator 470, where the charging and discharging module 440 includes a first current source 441 and a second current source 442, and the integrator 450 includes an integrating capacitor 451 and an amplifier 452.

The capacitance detecting circuit further includes a set of charging and discharging switches, a set of clearing switches and a set of integrating switches, where the set of charging and discharging switches includes a first switch 431, a second switch 432, a third switch 433 and a fourth switch 434, the set of integrating switches includes a fifth switch 435, and the set of clearing switches includes a sixth switch 436.

It should be noted that the circuit structure of the embodiment shown in FIG. 4 is similar to that of the embodiment shown in FIG. 2, except that in the embodiment shown in FIG. 2, one end of the first current source and one end of the second current source are connected to a power supply voltage, one end of the third switch and one end of the fourth switch are grounded, and in the embodiment shown in FIG. 4, one end of the first current source and one end of the second current source are grounded, and one end of the third switch and one end of the fourth switch are connected to a power supply voltage. For example, one end (for example, an upper plate) of the calibration capacitor 420 is grounded through the second switch 432 and the second current source 442, and the same end (for example, the upper plate) of the calibration capacitor 420 is connected to the power supply voltage $V_{DD}$ through the fourth switch 434, and the other end (for example, a lower plate) of the calibration capacitor 420 is grounded. Connection relationships of other elements in FIG. 4 will not be repeatedly described here.

Hereinafter, a working process of the capacitance detecting circuit shown in FIG. 4 will be described in detail with reference to a logic timing diagram shown in FIG. 5.

Figure 5:
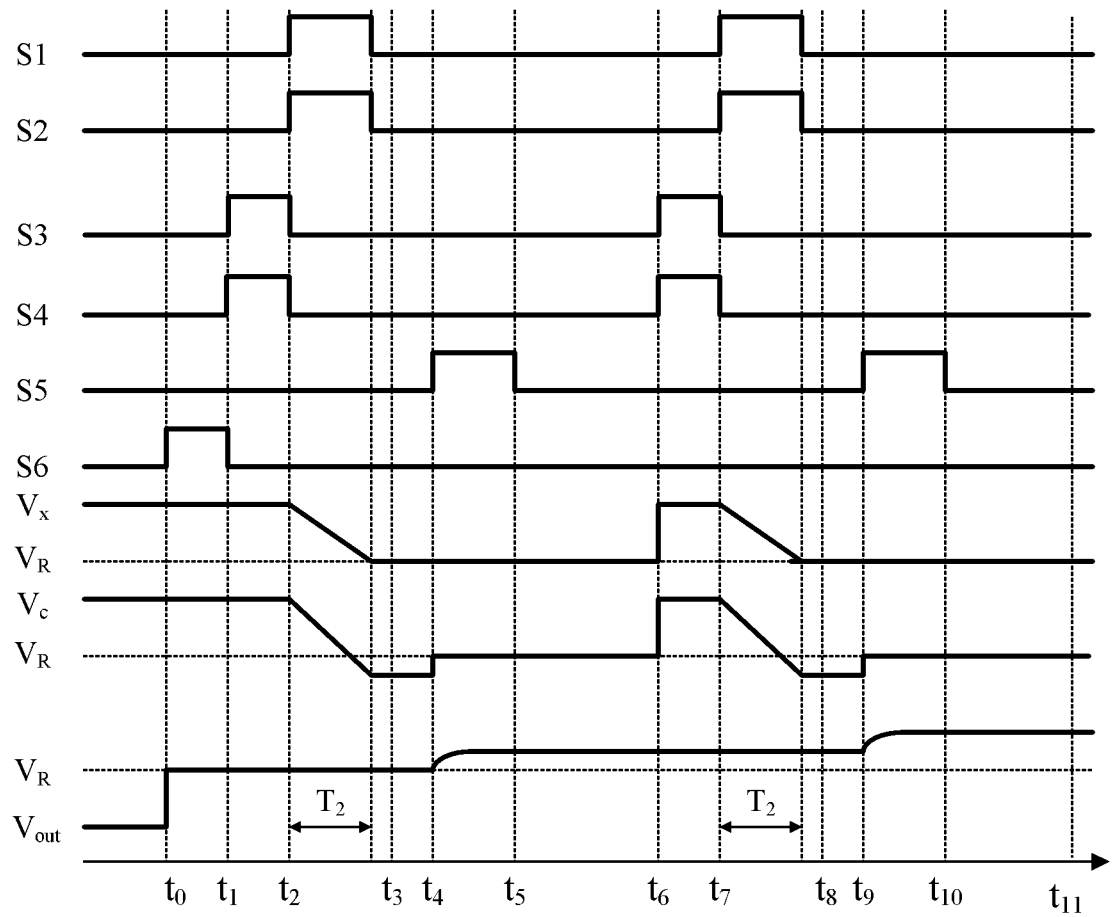
FIG. 5 is a logic timing diagram of a capacitance detecting circuit according to another embodiment of the present application.

It should be noted that in FIG. 5, S1-S6 are waveform diagrams of control signals of the first switch 431 to the sixth switch 436, respectively. When a control signal is at a high level, the corresponding switch is turned on, and when the control signal is at a low level, the corresponding switch is turned off. Certainly, turn-on or turn-off of the switches may also correspond to a low level and a high level, respectively. $V_x$ and $V_c$ are voltage curves of the measurement capacitor 410 and the calibration capacitor 420, respectively, and $V_{out}$ is the output voltage of the integrator 450.

Similar to the foregoing embodiment, in a charge clearing phase (corresponding to a time period $t_0$–$t_1$ in FIG. 5), the sixth switch 436 is turned on, and the first switch 431, the second switch 432, the third switch 433, the fourth switch 434 and the fifth switch 435 are all turned off, charges stored on the integrating capacitor 451 are cleared; that is, the quantity of charges on the integrating capacitor 451 is zero at time $t_1$, and the output voltage $V_{out}$ of the integrator 450 is equal to $V_R$ according to a virtual short characteristic of an amplifier.

A charging and discharging phase in this embodiment differs from the foregoing embodiment in that: in this embodiment, the charging phase is prior to the discharging phase, that is, the measurement capacitor and the calibration capacitor are first charged, and then the measurement capacitor and the calibration capacitor are discharged, where the charging phase corresponds to a time period $t_1$-$t_2$ in FIG. 5 and the discharging phase corresponds to a time period $t_2$-$t_3$ in FIG. 5.

Specifically, in the time period $t_1$-$t_2$, the third switch 433 and the fourth switch 434 are turned on, the first switch 431, the second switch 432, the fifth switch 435 and the sixth switch 436 are all turned off, and the measurement capacitor 410 and the calibration capacitor 420 are charged to a power supply voltage $V_{DD}$, that is, in the charging phase, the power supply voltage $V_{DD}$ fully charges the measurement capacitor 410 and the calibration capacitor 420; at time $t_2$, the quantity of charges $Q_{Cx}$ stored on the measurement capacitor 410 is as follows $Q_{Cx}=C_xV_{DD}$, the quantity of charges $Q_{Cc}$ stored on the calibration capacitor 420 is as follows $Q_{Cc}=C_cV_{DD}$, and the output voltage $V_{out}$ of the integrator 450 is $V_R$.

In the time period $t_2$-$t_3$, the first switch 431 and the second switch 432 are turned on, the third switch 433, the fourth switch 434, the fifth switch 435 and the sixth switch 436 are all turned off, and the first current source 441 performs discharging on the measurement capacitor 410 and the second current source 442 performs discharging on the calibration capacitor 420. When the measurement capacitor 410 is discharged until a voltage $V_x$ is equal to the reference voltage $V_R$, an output state of the comparator 470 is reversed. At this time, the control module controls the first switch 431 and the second switch 432 to be turned off, that is, controlling the first current source 441 and the second current source 442 to stop performing discharging on the measurement capacitor 410 and the calibration capacitor 420.

A duration $T_2$ required for performing discharging on the measurement capacitor 410 from the power supply voltage $V_{DD}$ to a voltage equal to the reference voltage $V_R$ is as follows:

$$T_2 = \frac{(V_{DD} - V_R)C_x}{I_1}, \qquad \text{Equation (7)}$$

where the $C_x$ is the reference capacitance value of the measurement capacitor 410 and $I_1$ is the current value of the first current source 441.

Since a discharging duration of the calibration capacitor 420 is equal to that of the measurement capacitor 410, and then at time $t_3$, the quantity of charges $Q_{Cc}$ stored on the calibration capacitor 420 is as follows:

$$Q'_{Cc} = Q_{Cc} - I_2T_2 = C_cV_{DD} - \frac{I_2(V_{DD} - V_R)C_x}{I_1}, \qquad \text{Equation (8)}$$

where the $C_c$ is the capacitance value of the calibration capacitor 420 and $I_2$ is the current value of the second current source 442.

Since the measurement capacitor 420 needs a time period $T_2$ to discharge from the power supply voltage to the reference voltage $V_R$, a duration of the time period $t_2$-$t_3$ needs to be greater than or equal to the duration $T_2$, that is, $t_3-t_2 \leq T_2$.

Similar to the foregoing embodiment, in order to avoid charge leakage caused by frequent switching of switches, a first buffering phase (corresponding to a time period $t_3$-$t_4$ in FIG. 5) may be further included after the charging and discharging phase. In the first buffering phase, charges on the measurement capacitor 410, the calibration capacitor 420 and the integrating capacitor 451 remain unchanged, and specifically, in the first buffering phase, the first switch 431 to the sixth switch 436 are all turned off.

Thereafter, in the charge transferring phase (corresponding to a time period $t_4$-$t_5$ in FIG. 5), the fifth switch 435 is turned on, and the first switch 431, the second switch 432, the third switch 433, the fourth switch 434 and the sixth switch 436 are all turned off. Due to a virtual short characteristic of an amplifier, a voltage at a negative input end of the amplifier 452 is equal to that of a positive input end of the amplifier, that is, both are equal to the reference voltages $V_R$. Therefore, a voltage of an upper plate of the calibration capacitor 420 and a voltage of a left plate of the integrating capacitor 451 are clamped to the reference voltage $V_R$; and due to a virtual open characteristic of an amplifier, in the time period $t_4$-$t_5$, charges stored on the calibration capacitor 420 are redistributed on the calibration capacitor 420 and the integrating capacitor 451, and a charge balance equation is as shown in Equation (9):

$$C_cV_{DD} - \frac{I_2(V_{DD} - V_R)C_x}{I_1} = V_RC_c + (V_R - V_{out}) \cdot C_S, \qquad \text{Equation (9)}$$

where the $C_S$ is the capacitance value of the integrating capacitor 451, the $V_RC_c$ is the quantity of charges stored on the calibration capacitor 420 after charge transfer, and the $(V_R-V_{out})\cdot C_S$ is the quantity of charges stored on the integrating capacitor 451 after charge transfer.

According to Equation (9), it can be seen that the output voltage $V_{out}$ of the integrator 450 is shown as follows:

$$V_{out} = V_R + \frac{(C_C - C_xI_2/I_1)}{C_S} \cdot (V_{DD} - V_R). \qquad \text{Equation (10)}$$

It can be seen from Equation (10) that, by controlling the capacitance value Cc of the calibration capacitor 420 and the current value $I_1$ of the first current source, the current value $I_2$ of the second current source satisfies $C_C-C_xI_2/I_1=0$, and thus, when the capacitance value of the measurement capacitor 410 is equal to the reference capacitance value, the output voltage of the integrator 450 is equal to the reference voltage $V_R$, that is, when the user does not operate the capacitance sensor, the output voltage of the integrator is equal to the reference voltage.

From the equation $C_C=C_X I_2/I_1$, it can be seen that $C_C<C_X$ can be achieved as long as $I_2/I_1<1$ is set, and thus a purpose of reducing the capacitance value of the calibration capacitor can be achieved.

Similar to the foregoing embodiment, a second buffering phase (corresponding to a time period $t_5$-$t_6$ in FIG. 5) may be further included after the charge transferring phase. In the second buffering phase, charges on the measurement capacitor 410, the calibration capacitor 420 and the integrating capacitor 451 remain unchanged, and specifically, in the second buffering phase, the first switch 431 to the sixth switch 436 are all turned off.

Optionally, in this embodiment, operations from the charging and discharging phase to the second buffering phase may be repeatedly executed for multiple times, which will not be repeatedly described here. Then, when the foregoing working processes are repeatedly executed for N times, the output voltage $V_{out}$ of the integrator is as follows:

$$V_{out} = V_R + \frac{(C_C - C_X I_2/I_1)}{C_S} \cdot (V_{DD} - V_R) \cdot N. \quad \text{Equation (11)}$$

In a case that $C_C = C_X I_2/I_1$ is satisfied, when the capacitance value of the measurement capacitor changes, for example, when the capacitance value of the measurement capacitor changes from the reference capacitance value $C_x$ to $C_x + \Delta C_x$, the output voltage of the integrator 450 is as follows:

$$V_{out} = V_R - \frac{\Delta C_X I_2/I_1}{C_S} \cdot (V_{DD} - V_R) \cdot N. \quad \text{Equation (12)}$$

It can be seen from Equation (12) that the foregoing working processes are repeatedly executed for multiple times, which is beneficial for improving sensitivity of capacitance detection.

Therefore, according to the capacitance detecting circuit of an embodiment of the present application, the measurement capacitor and the calibration capacitor are first charged, and the first current source performs discharging on the measurement capacitor and the second current source performs discharging on the calibration capacitor, and thus a purpose of controlling a proportional relationship between the reference capacitance value and the capacitance value of the calibration capacitor through the proportional relationship between the current value of the first current source and the current value of the second current source can be achieved. Therefore, as long as the current value of the first current source is set to be greater than the current value of the second current source, a purpose of reducing the capacitance value of the calibration capacitor can be achieved, and thus the area of the capacitance detecting circuit and the costs of the chip can be reduced.

Figure 6:
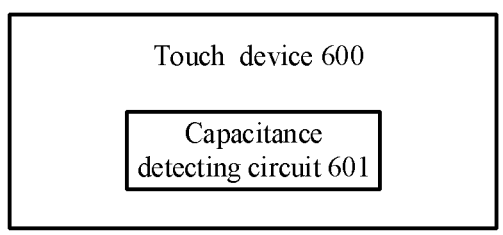
FIG. 6 is a schematic structural diagram of a touch device according to an embodiment of the present application.

An embodiment of the present application also provides a touch device. FIG. 6 shows a schematic structural diagram of a touch device 600 according to the embodiment of the present application. As shown in FIG. 6, the touch device 600 may include a capacitance detecting circuit 601, which may be the capacitance detecting circuit described in the foregoing embodiment. Optionally, the touch device may be a capacitance sensor, and a user may operate a sensing area of the capacitance sensor, so that a capacitance effect may be generated between the user and the sensing area. Further, the capacitance detecting circuit may convert the capacitance effect into a voltage signal, and then the voltage signal may be converted into a digital signal. Further, information about the user operating the capacitance sensor such as touch position and the like, may be determined according to the digital signal.

Figure 7:
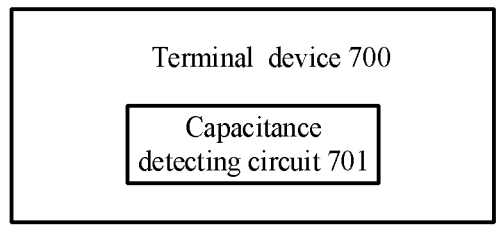
FIG. 7 is a schematic structural diagram of a terminal device according to an embodiment of the present application.

An embodiment of the present application also provides a terminal device, and FIG. 7 shows a schematic structural diagram of a terminal device 700 of the embodiment of the present application. As shown in FIG. 7, the terminal device may include a capacitance detecting circuit 701, which may be the capacitance detecting circuit described in the foregoing embodiment, and the capacitance detecting circuit may be configured to detect information about a user operating the capacitance detecting circuit such as touch position and the like.

By way of example but not limitation, the terminal device 700 may be a mobile phone, a tablet computer, a notebook computer, a desktop computer, an in-vehicle electronic device, a wearable smart device, or the like.

The foregoing descriptions are merely specific embodiments of the present application, however, the protection scope of the present application is not limited thereto, persons skilled in the art who are familiar with the art could readily think of variations or substitutions within the technical scope disclosed by the present application, and these variations or substitutions shall fall within the protection scope of the present application. Therefore, the protection scope of the present application shall be subject to the protection scope of the claims.

What is claimed is:

1. A capacitance detecting circuit, connected to a measurement capacitor, comprising:
   a calibration capacitor;
   a charging and discharging module comprising a first current source configured to perform charging on the measurement capacitor, and a second current source configured to perform charging on the calibration capacitor, or the first current source configured to perform discharging on the measurement capacitor, and the second current source configured to perform discharging on the calibration capacitor;
   an integrator, configured to convert a capacitance signal of the measurement capacitor into a voltage signal; and
   a control module, configured to control working states of the charging and discharging module and the integrator;
   wherein the capacitance detecting circuit further comprises a set of charging and discharging switches, a set of clearing switches and a set of integrating switches, and the integrator comprises an integrating capacitor and an amplifier;
   the control module is configured to:
   in a charge clearing phase, clear charges stored on the integrating capacitor through the set of clearing switches;
   in a charging and discharging phase, control the first current source to perform charging or discharging on the measurement capacitor through the set of charging and discharging switches and control the second current source to perform charging or discharging on the calibration capacitor through the set of charging and discharging switches, wherein in the charging and discharging phase, the measurement capacitor is charged or discharged until a voltage is equal to a reference voltage, a charging duration of the calibration capacitor is equal to a charging duration of the measurement capacitor, or a discharging duration of the calibration capacitor is equal to a discharging duration of the measurement capacitor; and
   in a charge transferring phase, control a part of charges stored on the calibration capacitor to be transferred to the integrating capacitor through the set of integrating switches;
   wherein the set of charging and discharging switches comprises a first switch, a second switch, a third switch and a fourth switch, the set of integrating switches comprises a fifth switch, and the set of clearing switches comprises a sixth switch;

one end of the first switch is connected to one end of the first current source, the other end of the first current source is connected to a power supply voltage, the other end of the first switch is connected to one end of the measurement capacitor and one end of the third switch, and the other end of the measurement capacitor and the other end of the third switch are grounded;

one end of the second switch is connected to one end of the second current source, the other end of the second current source is connected to a power supply voltage, the other end of the second switch is connected to one end of the calibration capacitor and one end of the fourth switch, and the other end of the calibration capacitor and the other end of the fourth switch are grounded;

one end of the fifth switch is connected to one end of the calibration capacitor, the other end of the fifth switch is connected to a first input end of the amplifier, and a second input end of the amplifier is configured to input the reference voltage; and the sixth switch is connected in parallel with the integrating capacitor, and the integrating capacitor is connected in parallel with the amplifier; and in the charge clearing phase, the sixth switch is turned on, the first switch, the second switch, the third switch, the fourth switch, and the fifth switch are all turned off, and charges stored on the integrating capacitor are cleared; and the charging and discharging phase comprises a discharging phase and a charging phase, and the discharging phase is prior to the charging phase, wherein in the discharging phase, the third switch and the fourth switch are turned on, the first switch, the second switch, the fifth switch and the sixth switch are all turned off, charges stored on the measurement capacitor and the calibration capacitor are cleared;

in the charging phase, the first switch and the second switch are turned on, the third switch, the fourth switch, the fifth switch and the sixth switch are all turned off, the measurement capacitor is charged until the voltage is equal to the reference voltage, and after the measurement capacitor is charged until the voltage is equal to the reference voltage, the first switch and the second switch are turned off; and in the charge transferring phase, the first switch, the second switch, the third switch, the fourth switch and the sixth switch are all turned off, the fifth switch is turned on, and a part of charges on the calibration capacitor are transferred to the integrating capacitor.

2. The capacitance detecting circuit according to claim 1, wherein a first buffering phase is comprised between the charging and discharging phase and the charge transferring phase, and a second buffering phase is comprised after the charge transferring phase, wherein the first buffering phase and the second buffering phase are used to maintain charges on the measurement capacitor, the calibration capacitor and the integrating capacitor unchanged;

wherein in the first buffering phase and the second buffering phase, the first switch, the second switch, the third switch, the fourth switch, the fifth switch and the sixth switch are all turned off.

3. The capacitance detecting circuit according to claim 2, wherein the control module is further configured to:
control the set of charging and discharging switches, the set of integrating switches, and the set of clearing switches to repeatedly execute operations from the charging and discharging phase to the second buffering phase for multiple times.

4. The capacitance detecting circuit according to claim 3, wherein an output voltage $V_{out}$ of the integrator is:

$$V_{out} = V_R - \frac{\Delta C_x I_2 / I_1}{C_S} V_R N$$

wherein the $V_R$ is the reference voltage, the $\Delta C_x$ is a variation of a capacitance value of the measurement capacitor with respect to a reference capacitance value, the $C_S$ is a capacitance value of the integrating capacitor, the $I_1$ is a current value of the first current source, the $I_2$ is a current value of the second current source, and the N is the number of execution times from the charging and discharging phase to the second buffering phase.

5. The capacitance detecting circuit according to claim 1, wherein the capacitance detecting circuit further comprises a comparator, a first input end of the comparator is connected to the measurement capacitor, a second input end of the comparator is configured to input the reference voltage, and an output end of the comparator is connected to the control module;

when a voltage of the measurement capacitor reaches the reference voltage, an output signal of the comparator is reversed, and the control module controls the charging and discharging module to stop performing charging or discharging on the measurement capacitor and the calibration capacitor.

6. The capacitance detecting circuit according to claim 1, wherein the capacitance detecting circuit further comprises a processing module configured to determine a variation of a capacitance value of the measurement capacitor with respect to a reference capacitance value according to an output voltage of the integrator.

7. The capacitance detecting circuit according to claim 1, wherein a current value of the first current source is greater than a current value of the second current source.

8. The capacitance detecting circuit according to claim 1, wherein the calibration capacitor is configured to cause an output voltage of the integrator to be equal to a reference voltage when a capacitance value of the measurement capacitor is equal to a reference capacitance value, wherein a ratio of the reference capacitance value to a capacitance value of the calibration capacitor is equal to a ratio of a current value of the first current source to a current value of the second current source.

9. A capacitance detecting circuit, connected to a measurement capacitor, comprising:
a calibration capacitor;
a charging and discharging module comprising a first current source configured to perform charging on the measurement capacitor, and a second current source configured to perform charging on the calibration capacitor, or the first current source configured to perform discharging on the measurement capacitor, and the second current source configured to perform discharging on the calibration capacitor;
an integrator, configured to convert a capacitance signal of the measurement capacitor into a voltage signal; and
a control module, configured to control working states of the charging and discharging module and the integrator;

wherein the capacitance detecting circuit further comprises a set of charging and discharging switches, a set of clearing switches and a set of integrating switches, and the integrator comprises an integrating capacitor and an amplifier;

the control module is configured to:

in a charge clearing phase, clear charges stored on the integrating capacitor through the set of clearing switches;

in a charging and discharging phase, control the first current source to perform charging or discharging on the measurement capacitor through the set of charging and discharging switches and control the second current source to perform charging or discharging on the calibration capacitor through the set of charging and discharging switches, wherein in the charging and discharging phase, the measurement capacitor is charged or discharged until a voltage is equal to a reference voltage, a charging duration of the calibration capacitor is equal to a charging duration of the measurement capacitor, or a discharging duration of the calibration capacitor is equal to a discharging duration of the measurement capacitor; and in a charge transferring phase, control a part of charges stored on the calibration capacitor to be transferred to the integrating capacitor through the set of integrating switches;

wherein the set of charging and discharging switches comprises a first switch, a second switch, a third switch and a fourth switch, the set of integrating switches comprises a fifth switch, and the set of clearing switches comprises a sixth switch;

one end of the first switch is connected to one end of the first current source, the other end of the first current source is grounded, the other end of the first switch is connected to one end of the measurement capacitor and one end of the third switch, the other end of the measurement capacitor is grounded, and the other end of the third switch is connected to a power supply voltage;

one end of the second switch is connected to one end of the second current source, the other end of the second current source is grounded, the other end of the second switch is connected to one end of the calibration capacitor and one end of the fourth switch, the other end of the calibration capacitor is grounded, and the other end of the fourth switch is connected to a power supply voltage;

one end of the fifth switch is connected to one end of the calibration capacitor, the other end of the fifth switch is connected to a first input end of the amplifier, and a second input end of the amplifier is configured to input the reference voltage; and the sixth switch is connected in parallel with the integrating capacitor, and the integrating capacitor is connected in parallel with the amplifier;

in the charge clearing phase, the sixth switch is turned on, the first switch, the second switch, the third switch, the fourth switch, and the fifth switch are all turned off, and charges stored on the integrating capacitor are cleared; and the charging and discharging phase comprises a charging phase and a discharging phase, and the charging phase is prior to the discharging phase, wherein in the charging phase, the third switch and the fourth switch are turned on, the first switch, the second switch, the fifth switch and the sixth switch are all turned off, the measurement capacitor and the calibration capacitor are both charged until a voltage is equal to the power supply voltage;

in the discharging phase, the first switch and the second switch are turned on, the third switch, the fourth switch, the fifth switch and the sixth switch are all turned off, the measurement capacitor is discharged from the power supply voltage to a voltage equal to the reference voltage, and after the measurement capacitor is discharged until the voltage is equal to the reference voltage, the first switch and the second switch are turned off; and in the charge transferring phase, the first switch, the second switch, the third switch, the fourth switch and the sixth switch are all turned off, the fifth switch is turned on, and a part of charges on the calibration capacitor are transferred to the integrating capacitor.

10. The capacitance detecting circuit according to claim 9, wherein a first buffering phase is comprised between the charging and discharging phase and the charge transferring phase, and a second buffering phase is comprised after the charge transferring phase, wherein the first buffering phase and the second buffering phase are used to maintain charges on the measurement capacitor, the calibration capacitor and the integrating capacitor unchanged;

wherein in the first buffering phase and the second buffering phase, the first switch, the second switch, the third switch, the fourth switch, the fifth switch and the sixth switch are all turned off.

11. The capacitance detecting circuit according to claim 10, wherein the control module is further configured to:

control the set of charging and discharging switches, the set of integrating switches, and the set of clearing switches to repeatedly execute operations from the charging and discharging phase to the second buffering phase for multiple times.

12. The capacitance detecting circuit according to claim 11, wherein an output voltage $V_{out}$ of the integrator is:

$$V_{out} = V_R - \frac{\Delta C_x I_2 / I_1}{C_S}(V_{DD} - V_R) \cdot N$$

wherein the $V_R$ is the reference voltage, the $\Delta C_x$ is a variation of a capacitance value of the measurement capacitor with respect to a reference capacitance value, the $C_S$ is a capacitance value of the integrating capacitor, the $I_1$ is a current value of the first current source, the $I_2$ is a current value of the second current source, the $V_{DD}$ is the power supply voltage, and the N is the number of execution times from the charging and discharging phase to the second buffering phase.

13. The capacitance detecting circuit according to claim 9, wherein the capacitance detecting circuit further comprises a comparator, a first input end of the comparator is connected to the measurement capacitor, a second input end of the comparator is configured to input the reference voltage, and an output end of the comparator is connected to the control module;

when a voltage of the measurement capacitor reaches the reference voltage, an output signal of the comparator is reversed, and the control module controls the charging and discharging module to stop performing charging or discharging on the measurement capacitor and the calibration capacitor.

14. The capacitance detecting circuit according to claim 9, wherein the capacitance detecting circuit further comprises a processing module configured to determine a variation of a capacitance value of the measurement capacitor with respect to a reference capacitance value according to an output voltage of the integrator.

15. The capacitance detecting circuit according to claim 9, wherein the calibration capacitor is configured to cause an output voltage of the integrator to be equal to a reference voltage when a capacitance value of the measurement capacitor is equal to a reference capacitance value, wherein a ratio of the reference capacitance value to a capacitance value of the calibration capacitor is equal to a ratio of a current value of the first current source to a current value of the second current source.

16. The capacitance detecting circuit according to claim 9, wherein a current value of the first current source is greater than a current value of the second current source.

17. A touch device, comprising:
a touch sensor comprising a measurement capacitor; and
a capacitance detecting circuit, configured to detect variation of a capacitance value of the measurement capacitor with respect to a reference capacitance value, wherein the capacitance detecting circuit comprises:
a calibration capacitor;
a charging and discharging module comprising a first current source configured to perform charging on the measurement capacitor, and a second current source configured to perform charging on the calibration capacitor, or the first current source configured to perform discharging on the measurement capacitor, and the second current source configured to perform discharging on the calibration capacitor;
an integrator, configured to convert a capacitance signal of the measurement capacitor into a voltage signal; and
a control module, configured to control working states of the charging and discharging module and the integrator;
wherein the capacitance detecting circuit further comprises a set of charging and discharging switches, a set of clearing switches and a set of integrating switches, and the integrator comprises an integrating capacitor and an amplifier;
the control module is configured to:
in a charge clearing phase, clear charges stored on the integrating capacitor through the set of clearing switches;
in a charging and discharging phase, control the first current source to perform charging or discharging on the measurement capacitor through the set of charging and discharging switches and control the second current source to perform charging or discharging on the calibration capacitor through the set of charging and discharging switches, wherein in the charging and discharging phase, the measurement capacitor is charged or discharged until a voltage is equal to a reference voltage, a charging duration of the calibration capacitor is equal to a charging duration of the measurement capacitor, or a discharging duration of the calibration capacitor is equal to a discharging duration of the measurement capacitor; and
in a charge transferring phase, control a part of charges stored on the calibration capacitor to be transferred to the integrating capacitor through the set of integrating switches;
wherein the set of charging and discharging switches comprises a first switch, a second switch, a third switch and a fourth switch, the set of integrating switches comprises a fifth switch, and the set of clearing switches comprises a sixth switch;
one end of the first switch is connected to one end of the first current source, the other end of the first current source is connected to a power supply voltage, the other end of the first switch is connected to one end of the measurement capacitor and one end of the third switch, and the other end of the measurement capacitor and the other end of the third switch are grounded;
one end of the second switch is connected to one end of the second current source, the other end of the second current source is connected to a power supply voltage, the other end of the second switch is connected to one end of the calibration capacitor and one end of the fourth switch, and the other end of the calibration capacitor and the other end of the fourth switch are grounded;
one end of the fifth switch is connected to one end of the calibration capacitor, the other end of the fifth switch is connected to a first input end of the amplifier, and a second input end of the amplifier is configured to input the reference voltage; and
the sixth switch is connected in parallel with the integrating capacitor, and the integrating capacitor is connected in parallel with the amplifier; and
in the charge clearing phase, the sixth switch is turned on, the first switch, the second switch, the third switch, the fourth switch, and the fifth switch are all turned off, and charges stored on the integrating capacitor are cleared; and
the charging and discharging phase comprises a discharging phase and a charging phase, and the discharging phase is prior to the charging phase,
wherein in the discharging phase, the third switch and the fourth switch are turned on, the first switch, the second switch, the fifth switch and the sixth switch are all turned off, charges stored on the measurement capacitor and the calibration capacitor are cleared;
in the charging phase, the first switch and the second switch are turned on, the third switch, the fourth switch, the fifth switch and the sixth switch are all turned off, the measurement capacitor is charged until the voltage is equal to the reference voltage, and after the measurement capacitor is charged until the voltage is equal to the reference voltage, the first switch and the second switch are turned off; and
in the charge transferring phase, the first switch, the second switch, the third switch, the fourth switch and the sixth switch are all turned off, the fifth switch is turned on, and a part of charges on the calibration capacitor are transferred to the integrating capacitor.

18. The touch device according to claim 17, wherein in a charge transferring phase, control a part of charges stored on the calibration capacitor to in a first buffering phase between the charging and discharging phase and the charge transferring phase, and in a second buffering phase after the charge transferring phase, charges on the measurement capacitor are maintained and the calibration capacitor and the integrating capacitor are unchanged.

19. The touch device according to claim 18, wherein an output voltage $V_{out}$ of the integrator is:

$$V_{out} = V_R - \frac{\Delta C_x I_2 / I_1}{C_S} V_R N$$

wherein the $V_R$ is the reference voltage, the $\Delta C_x$ is a variation of a capacitance value of the measurement capacitor with respect to a reference capacitance value, the $C_S$ is a capacitance value of the integrating capacitor, the $I_1$ is a current value of the first current source, the $I_2$ is a current value of the second current source, and the N is the number of execution times from the charging and discharging phase to the second buffering phase.

20. The touch device according to claim 17, wherein the reference capacitance value is a capacitance value of the measurement capacitor when the touch sensor is not touched.

* * * * *